(12) United States Patent
Raghuraman

(10) Patent No.: US 11,531,061 B2
(45) Date of Patent: Dec. 20, 2022

(54) INTERLEAVED TESTING OF DIGITAL AND ANALOG SUBSYSTEMS WITH ON-CHIP TESTING INTERFACE

(71) Applicant: QUALCOMM Incorporated, San Diego, CA (US)

(72) Inventor: Praveen Raghuraman, Chennai (IN)

(73) Assignee: QUALCOMM Incorporated, San Diego, CA (US)

( * ) Notice: Subject to any disclaimer, the term of this patent is extended or adjusted under 35 U.S.C. 154(b) by 187 days.

(21) Appl. No.: 16/983,938

(22) Filed: Aug. 3, 2020

(65) Prior Publication Data

US 2022/0034965 A1    Feb. 3, 2022

(51) Int. Cl.
| | | |
|---|---|---|
| G01R 31/317 | (2006.01) | |
| G01R 31/3167 | (2006.01) | |
| G01R 31/3177 | (2006.01) | |

(52) U.S. Cl.
CPC ...  *G01R 31/31718* (2013.01); *G01R 31/3167* (2013.01); *G01R 31/3177* (2013.01); *G01R 31/31724* (2013.01)

(58) Field of Classification Search
None
See application file for complete search history.

(56) References Cited

U.S. PATENT DOCUMENTS

| | | | | |
|---|---|---|---|---|
| 8,935,584 | B2* | 1/2015 | Wan | G11C 29/40 714/726 |
| 11,037,651 | B2* | 6/2021 | Jain | G11C 29/32 |
| 11,442,107 | B2* | 9/2022 | Shin | G01R 31/31712 |
| 2015/0340103 | A1* | 11/2015 | Chakraborty | G11C 29/12015 714/719 |
| 2018/0259578 | A1* | 9/2018 | Raghuraman | G01R 31/3187 |
| 2020/0143902 | A1* | 5/2020 | Jain | G11C 29/48 |
| 2022/0170982 | A1* | 6/2022 | Nayak | G06F 1/06 |

FOREIGN PATENT DOCUMENTS

CN           1828553 A    *  9/2006  ............. G06F 11/36

* cited by examiner

*Primary Examiner* — Jermele M Hollington
(74) *Attorney, Agent, or Firm* — Seyfarth Shaw LLP/Qualcomm Incorporated

(57) ABSTRACT

The disclosure provides a method and apparatus of interleaved on-chip testing. The method merges a test setup for analog components with a test setup for digital components and then interleaves the execution of the digital components with the analog components. This provides concurrency via a unified mode of operation. The apparatus includes a system-on-chip test access port (SoC TAP) in communication with a memory test access port (MTAP). A built-in self-test (BIST) controller communicates with the MTAP, a physical layer, and a memory. A multiplexer is in communication with the memory and a phase locked loop (PLL) through an AND gate.

13 Claims, 7 Drawing Sheets

INTERLEAVED TESTING OF DIGITAL AND ANALOG SUBSYSTEMS WITH ON-CHIP TESTING INTERFACE

TECHNICAL FIELD

The present disclosure generally relates to methods and systems for on-chip testing of a wireless device. More specifically, the present disclosure relates to an on-chip parallel test interface using an interleaved architecture for execution.

BACKGROUND

Testing of system-on-chip (SoC) devices using a serial architecture necessitates testing of digital memory subsystems and analog subsystems in separate modes. Memory execution testing may be performed first and analog systems are then tested after the completion of memory testing. This serial testing is time-consuming and inefficient. A more serious drawback is that such serial testing does not reasonably simulate real-world use, which is concurrent operation of multiple digital and analog subsystems. SoC chips are included with analog subsystems in wireless devices and are increasingly used in automotive applications, including autonomous vehicles, vehicle safety systems, and communication interfaces with wireless devices.

Wireless devices and automotive systems, including SoCs, are tested to specific performance and safety specifications. An example of an automotive specification is International Electrotechnical Commission (IEC) 61508 "Functional Safety of Electrical/Electronic/Programmable Electronic Safety-related Systems (E/E/PES)." As both wireless devices and automobiles evolve, more features and functionality are packed into a steadily decreasing area. This has resulted in a reduced number of modes and the need to use the same testing pins for different modes, a time consuming process, as the current serial process tests with a dedicated mode. The serial testing architecture requires adaption for use on automatic test equipment (ATE) and does not replicate field use or a system level use case. An interleaved execution architecture that provides an on-chip interleaved test interface would improve testing time and provide a more realistic test scenario.

SUMMARY

The disclosure provides a method of interleaved on-chip testing. The method merges a test setup for analog components and digital components and then interleaves the execution of the digital components with the analog components. As a result the test setup achieves concurrency via a unified mode of operation.

In addition, the disclosure provides and apparatus for interleaved on-chip testing. The apparatus includes a system-on-chip test access port (SoC TAP) that is in communication with a memory test access port (MTAP). The apparatus further includes a built-in self-test (BIST) controller in communication with the MTAP, a physical layer, and a memory. A multiplexer is also included and is in communication with the memory and a phase locked loop (PLL) through an AND gate.

The disclosure also provides a further apparatus for interleaved on-chip testing. The apparatus includes means for merging a system-on-chip test access port (SoC TAP) to allow communication between the SoC TAP and a memory test access port (MTAP). The apparatus also provides means for communicating with the MTAP and a memory as well as means for communicating with the memory and a phase locked loop (PLL).

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described, the use of the term "and/or" is intended to represent an "inclusive OR," and the use of the term "or" is intended to represent an "exclusive OR."

Wireless devices are being integrated into many areas of our lives. The development of new technologies, such as autonomous vehicles and health applications, increasingly rely on wireless technologies. Users may perform multiple operations concurrently on their devices. One example could be a passenger in an autonomous vehicle making a call while the vehicle uses a navigation system to proceed to the programmed destination.

Testing such devices should ensure that the devices operate as specified, even when concurrent operations are taking place. This interleaved operation may involve a system-on-chip (SoC), phase locked loop (PLL), and memory, for example. Testing these devices in subsystems should mimic real-world operating conditions, ensure specified performance, and be efficiently performed. Current testing processes use serial testing methods, which do not reflect actual operating conditions. Serial testing has been used because of the separate modes of operation for memory and analog subsystems. Memory testing consists of read/write operations and may use Joint Test Action Group (JTAG) pins. Analog testing, such as loopback, lock detect, and clock routing operations, uses general purpose input/output pins. In addition, serial testing may complicate testing using automatic test equipment. The present disclosure describes a method of interleaved testing of digital and analog subsystems with an on-chip testing interface.

Figure 1:
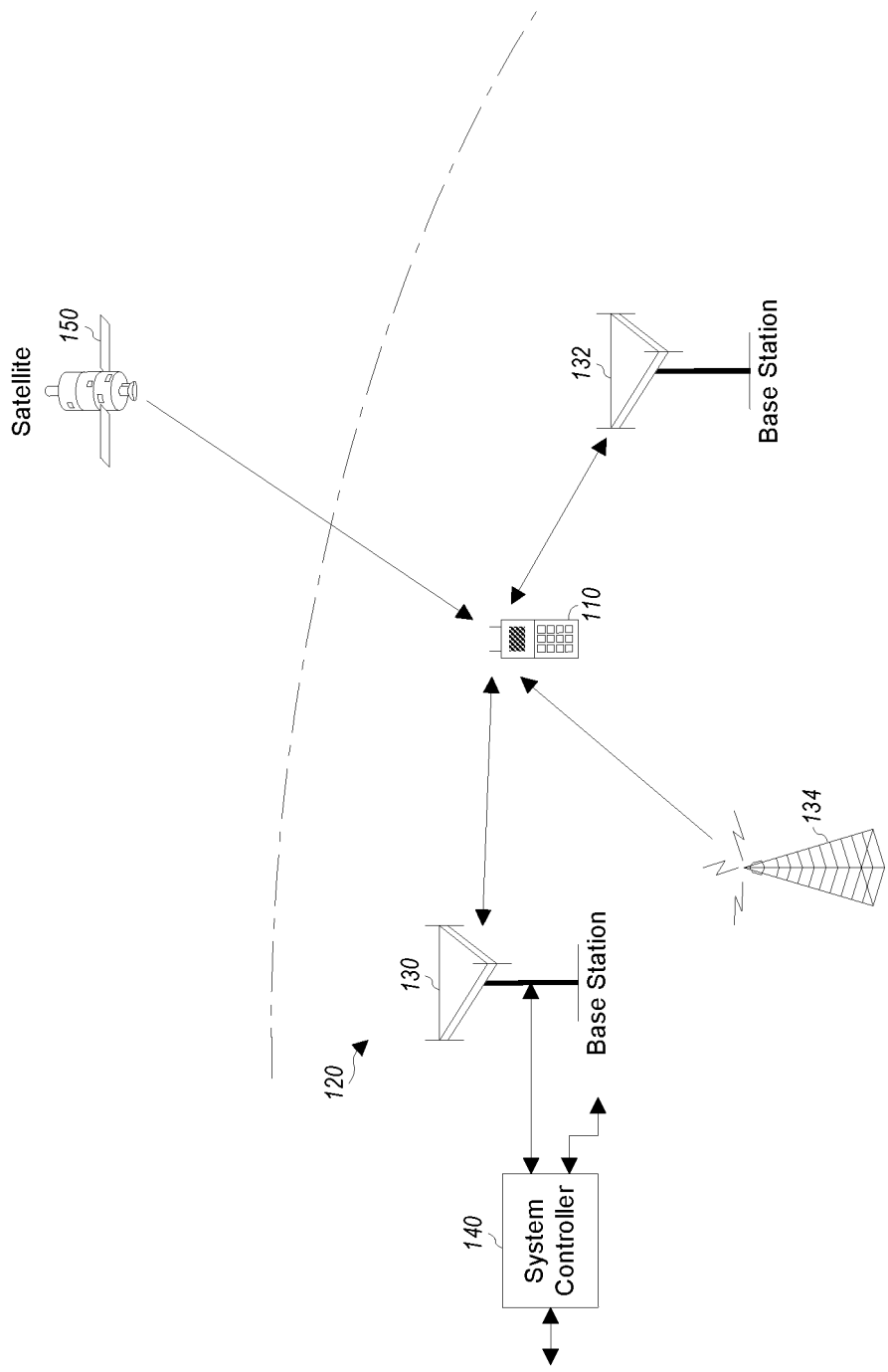
FIG. 1 shows a wireless device communicating with a wireless communications system in accordance with certain aspects of the disclosure.

FIG. 1 shows a wireless device communicating with a wireless communications system. The wireless device 110 may use the interleaved testing method prior to deployment with a user. The wireless device 110 communicates with a wireless communications system 120. The wireless communications system 120 may be a 5G new radio (NR) system, a long term evolution (LTE) system, a code division multiple access (CDMA) system, a global system for mobile communications (GSM) system, a wireless local area network (WLAN) system, millimeter wave (mmWave) technology, or some other wireless system. A CDMA system may implement wideband CDMA (WCDMA), time division synchronous CDMA (TD-SCDMA), CDMA2000, or some other version of CDMA. In a millimeter wave (mmWave) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

The wireless device 110 may be referred to as a mobile equipment, a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth® device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications, such as 5G NR, LTE, CDMA2000, WCDMA, TD-SCDMA, GSM, 802.11, etc.

Figure 2:
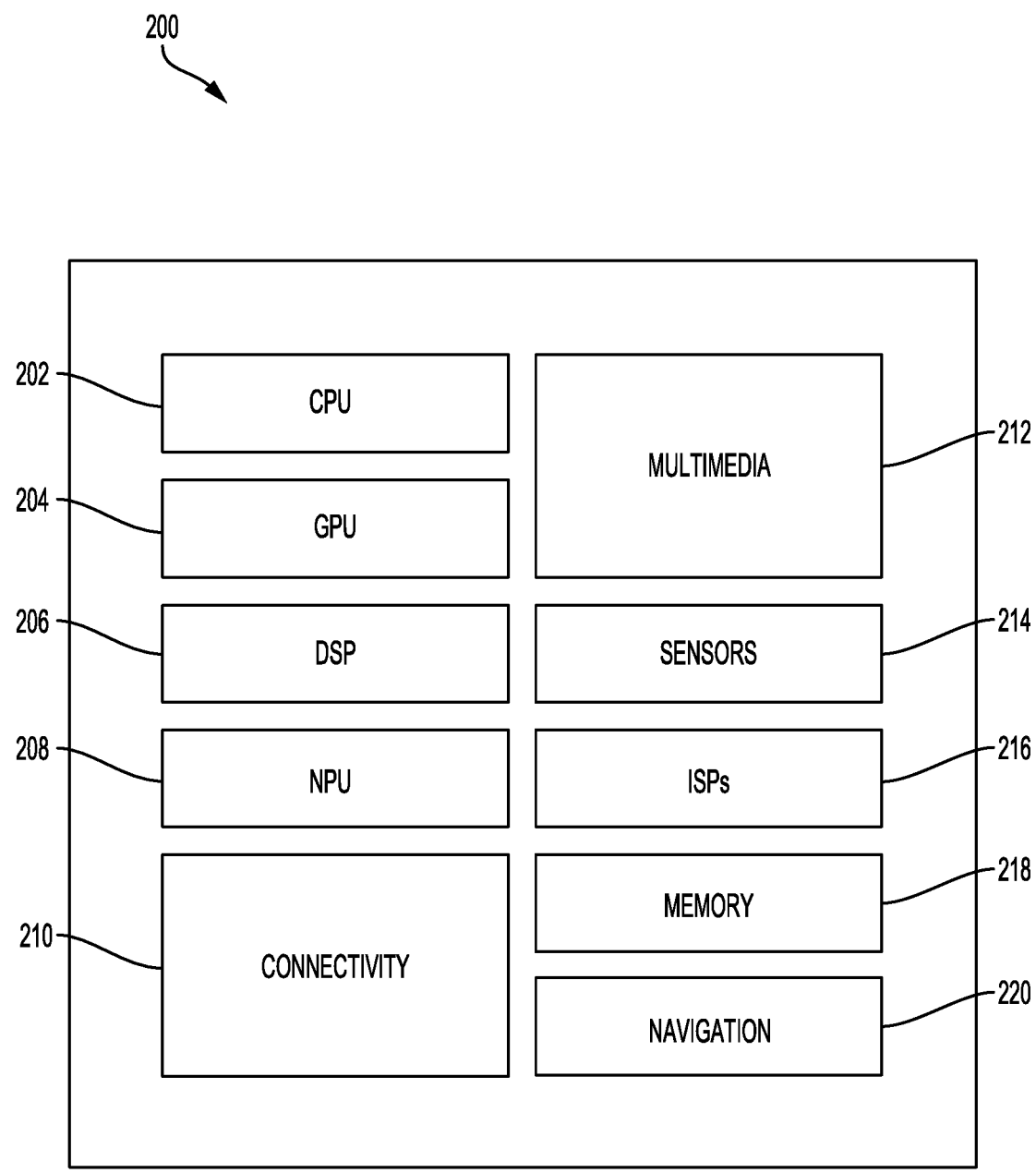
FIG. 2 illustrates an example implementation of a system-on-chip (SoC), one of the subsystems in a system architecture, in accordance with certain aspects of the present disclosure.

FIG. 2 illustrates an example implementation of a system-on-chip (SoC) 200 that may be tested in accordance with certain aspects of the present disclosure. The SoC 200 includes processing blocks tailored to specific functions, such as a connectivity block 210. The connectivity block 210 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the SoC 200 includes various processing cores that support multiple operations. For the configuration shown in FIG. 2, the host SoC 100 includes a multi-core central processing unit (CPU) 202, a graphics processor unit (GPU) 204, a digital signal processor (DSP) 206, and a neural processor unit (NPU) 208. The host SoC 200 may also include a sensor processor 214, image signal processors (ISPs) 216, a navigation module 220, which may include a global positioning system, and a memory 218. The multi-core CPU 202, the GPU 204, the DSP 206, the NPU 208, and the multi-media engine 212 support various functions such as video, audio, graphics, gaming, artificial networks, and the like. Each processor core of the multi-core CPU 202 may be a reduced instruction set computing (RISC) machine, an advanced RISC machine (ARM), a microprocessor, or some other type of processor. The NPU 208 may be based on an ARM instruction set.

Figure 3:
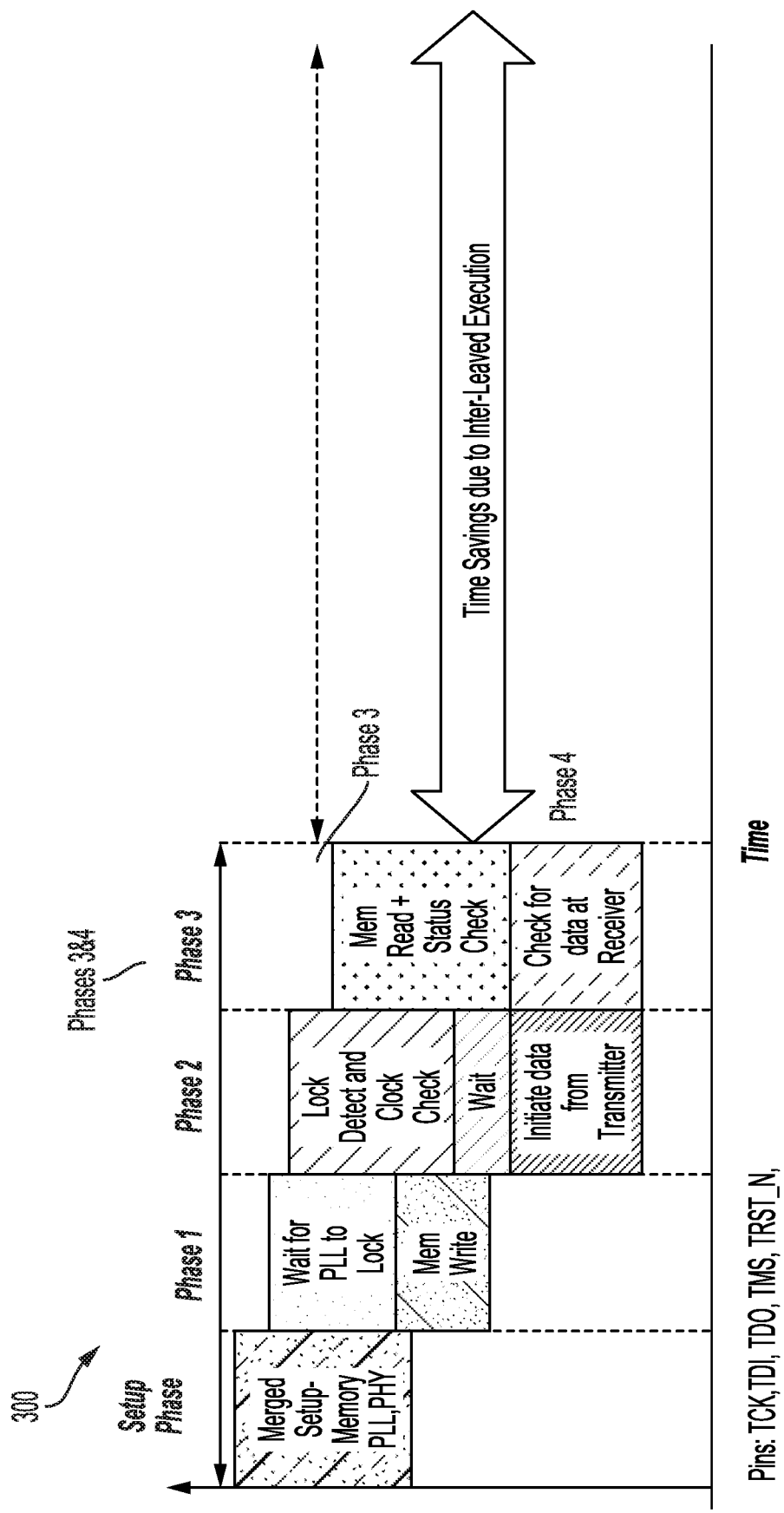
FIG. 3 is a block diagram of an interleaved test architecture having both digital and analog subsystems, according to aspects of the present disclosure.

FIG. 3 is a block diagram of an interleaved test architecture having both digital and analog subsystems, according to aspects of the present disclosure. A testing process 300 begins with a merged setup process that configures all components at the same time, for example, the memory, phase locked loop (PLL), and physical layer (PHY), prior to test initiation. Although these three particular analog and digital components are described in the example, the present disclosure is not limited to any particular components for analog or digital testing. During the setup phase, a system-on-chip (SoC) test access port (TAP) is utilized. A TAP implements a stateful protocol to access a set of test registers that present chip logic levels and device capabilities of various subsystems. A memory built-in self-test (MBIST) and physical layer setup operations are also performed. Once the setup phase has concluded, the interleaved execution of testing begins.

In Phase 1, a memory test access port (MTAP) is used and a memory write operation is performed. At the same time, the test architecture waits for the PLL to lock. Phase 2 begins and the SoC TAP is used to perform lock detection and a clock check. At this time the memory processing waits. Also concurrent with the lock detect and clock check and wait, a data transfer from the transmitter is initiated. This concludes Phase 2.

During Phase 3, a memory read operation is performed via the MTAP and a check for data at the receiver is performed to verify that the transmitted data is received. In Phase 4, the MTAP is utilized to perform a memory status check. The interleaving of SoC, memory, and analog subsystem testing results in significant savings in test time and exposes any interaction and issues between the various subsystems.

Figure 4:
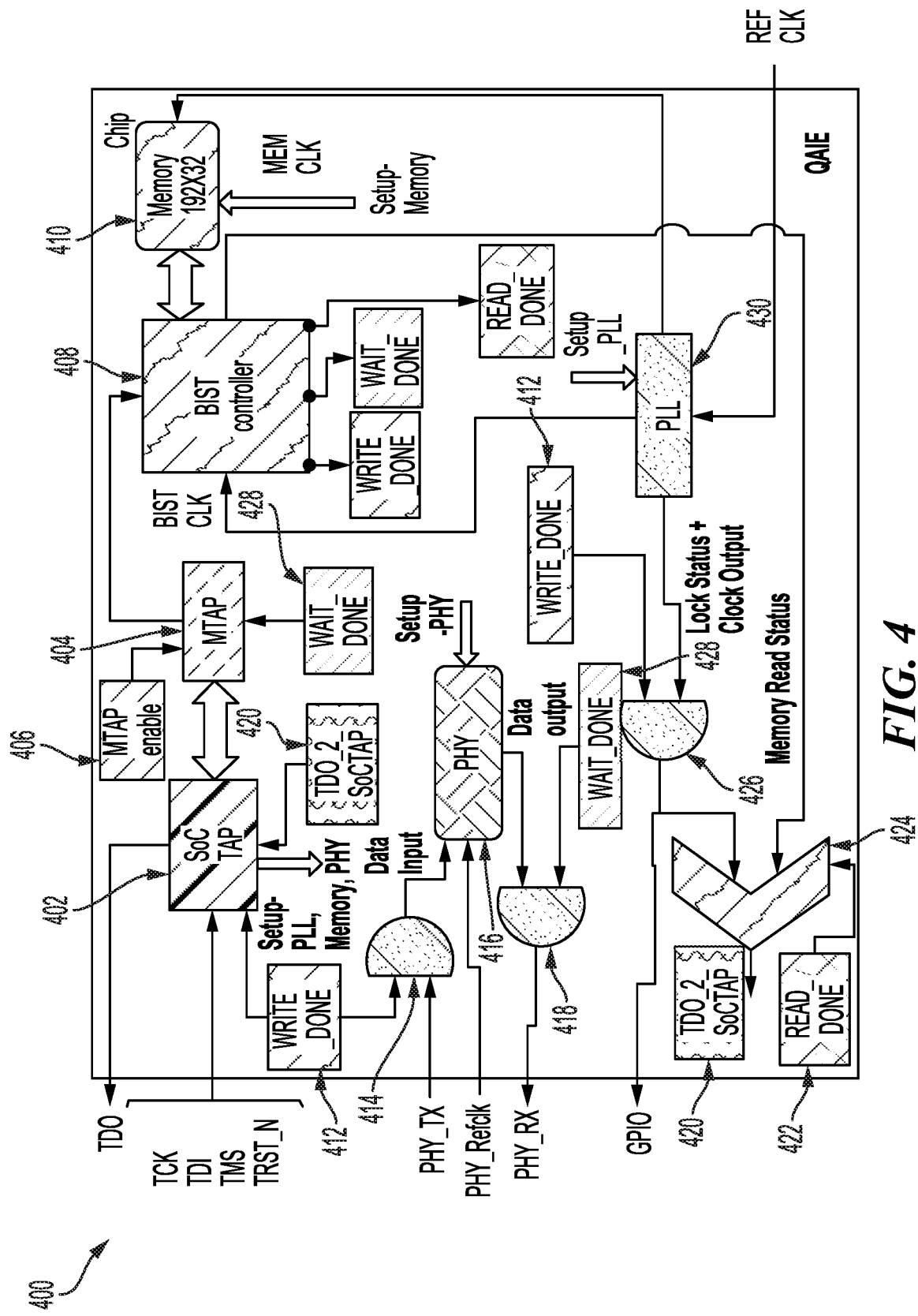
FIG. 4 is a functional block diagram for an interleaved testing process of a system having digital and analog subsystems, according to aspects of the present disclosure.

FIG. 4 is a functional block diagram for an interleaved testing process of a system having digital and analog subsystems, according to aspects of the present disclosure. An interleaved test execution architecture 400 includes a system-on-chip (SoC) test access port (TAP) 402 in communication with a memory test access port (MTAP) 404. The SoC TAP 402 issues setup commands to a phase locked loop (PLL) 430, memory 410, and physical layer (PHY) 416. The memory 410 may be a 192×32 memory, however, other memory sizes may be used. The MTAP 404 receives an MTAP enable command 406. The MTAP 404 is also in communication with a built-in self-test (BIST) controller 408, which is in communication with the memory 410. The memory 410 receives a memory clock input (MEM CLK) from the phased locked loop (PLL) 430 when the SoC TAP 402 communicates a setup memory command.

The physical layer (PHY) 416 is in communication with a first AND gate 414 and a second AND gate 418. The physical layer (PHY) 416 receives a PHY input from the SoC TAP 402 communicating a Setup-PHY command. The PLL 430 is in communication with a third AND gate 426 and also with the memory 410. The (PLL 430 receives, from the SoC TAP 402, a setup PLL command. The BIST controller 408 is in communication with the PLL 430, the MTAP 404, and also a multiplexer 424. The BIST controller 408 sets a READ_DONE signal 422 to high at the input of the multiplexer (MUX) 424, causing the MUX 424 to switch from a PLL lock status and clock output over to a BIST controller memory read status output. The PLL 430 is locked to a functional frequency using the input reference clock (REF CLK) throughout the testing process. The multiplexer 424 is in communication with the third AND gate 426.

In one aspect, the SoC TAP 402 uses a Joint Test Action Group (JTAG) five pin connector. During testing, a test probe connects only with a single JTAG port. The input pins include a test clock pin (TCK), test data in pin (TDI), test mode select pin (TMS), and test reset pin (TST_N). The SoC TAP 402 outputs the test data through a test data out (TDO) pin. The TRST_N pin provides an active-low reset to the test logic and is usually asynchronous, however, in this test architecture, the TRST_N pin operates synchronously. Operation of the testing apparatus of FIG. 4 will be described with respect to FIG. 5.

Figure 5:
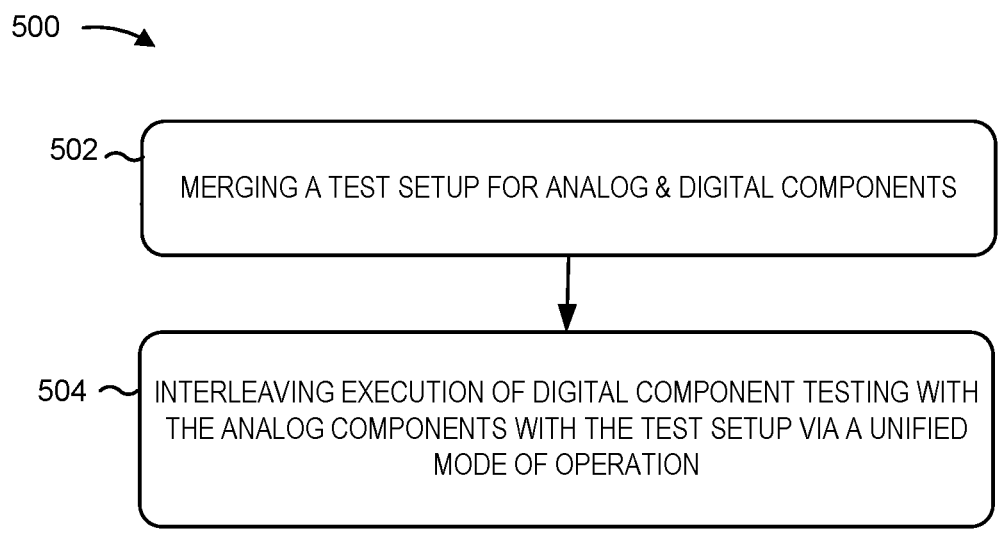
FIG. 5 is a flow diagram of a process for interleaved testing of digital and analog subsystems, according to aspects of the present disclosure.

FIG. 5 is a flow diagram of a process 500 for interleaved testing of digital and analog subsystems, according to aspects of the present disclosure. The process 500 begins in block 502, with merging a test setup for analog and digital components. The analog components include the PLL 430, which has a sinusoidal input, and the SoC TAP 402, which provides test access to the analog portion of the SoC. Merging the test setup involves merging the memory 410, BIST controller 408, PLL 430, and PHY 416 setup operations, in the example of FIG. 4.

Next, in block 504, interleaving execution of digital component testing with the analog components with a test setup via a unified mode of operation continues the testing. As seen in FIG. 4, interleaving the test execution begins with the MTAP enable command 406 to test the memory 410. A memory write operation is performed while waiting for the PLL 430 to lock. After completion of the memory write operation a WRITE_DONE 412 message is generated. The test interleaving continues with the SoC TAP 402. A lock detect and clock check is performed on the PLL 430. During the lock detect and clock check, data transmission from the transmitter begins with the PHY 416 transmission. After completion of the lock detect and clock check, memory wait period (WAIT_DONE) 428 is generated. The interleaving process continues with the MTAP 404 performing a memory read and a memory status check. At this point, the PHY 416 is tested to check for received data. The interleaving continues with the MTAP 404 to perform a memory status check concurrently with testing the PHY 416 for received data. Further processes of FIG. 4 are described with respect to FIG. 6.

Figure 6:
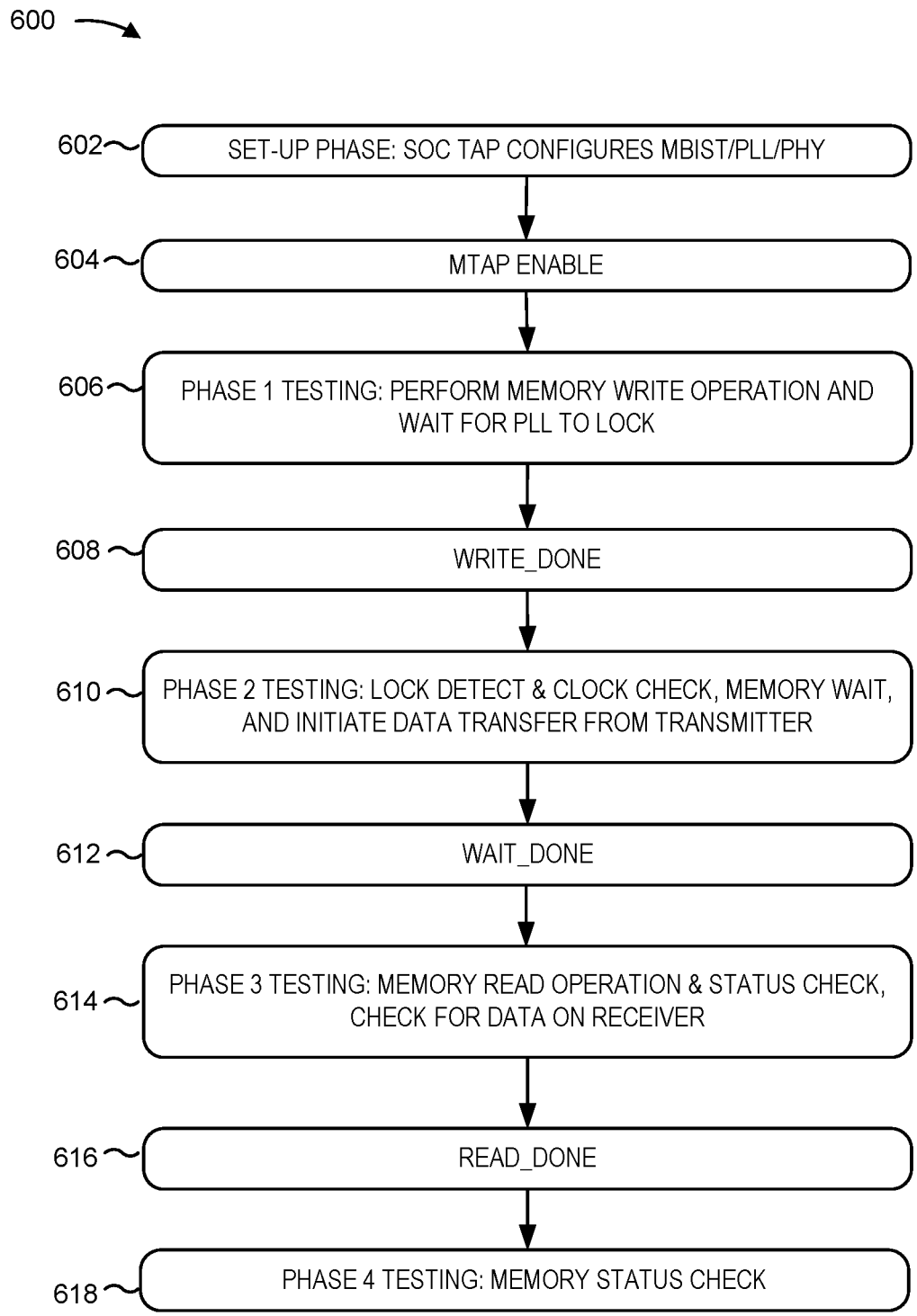
FIG. 6 is a flow diagram of a process for interleaved testing of digital and analog subsystems, according to aspects of the present disclosure.

FIG. 6 is a flow diagram of a process 600 for interleaved testing of digital and analog subsystems, according to aspects of the present disclosure. The process 600 begins with a setup phase in block 602. During the setup phase, all components (e.g., the SoC TAP 402, the MTAP 404, and the BIST controller 408) are configured for testing. The SoC TAP 402 initiates the setup of the PLL 430, the PHY 416, and the memory 410. The reference clock (REF CLK) is input to the PLL 430 as part of the setup phase. During the setup phase, the PLL 430 initiates lock. Once the SoC TAP 402 has completed the setup, the MTAP 404 is enabled using the MTAP enable command 406 in block 604.

Phase 1 begins with the memory 410 performing a write to memory operation in block 606. The memory write operation is interleaved with waiting for the PLL 430 to lock. When the memory write is complete, the BIST controller 408 sends a WRITE_DONE 412 signal to the third AND gate 426, the first AND gate 414, and the SoC TAP 402 in block 608. When the WRITE_DONE 412 signal is high, the third AND gate 426 passes the lock status and clock output to the MUX 424. The MUX 424 outputs a TDO 2 SoC TAP signal 420. In addition, the clock status and clock output from the third AND gate 426 is output via the general purpose input/output (GPIO). The WRITE_DONE 412 signal is also sent to the first AND gate 414, which allows PHY TX (transmit) data to pass to the PHY 416.

Phase 2 begins in block 610 when a WRITE_DONE 412 signal is high. During phase 2, the BIST controller 408 performs lock detect, clock check, and memory wait check. The PHY 416 initiates data transfer from PHY TX through the first AND gate 414. At block 612, the BIST controller 408 sets the WAIT_DONE 428 signal to high when the lock detect and memory wait tests conclude. The WAIT_DONE 428 signal is input to the second AND gate 418 and to the MTAP 404. When the WAIT_DONE 428 signal is high at the input to the second AND gate 418, the PHY data output passes through the second AND gate 418 to the PHY RX (receiver).

The WAIT DONE 428 signal initiates the MTAP 404 phase 3 testing in block 614. The BIST controller 408 performs a memory read operation and status check of the memory 410. The PHY 416 then checks for data output on the external receiver. When the BIST controller 408 completes the memory read operation and status check, the BIST controller 408 sets the READ_DONE signal 422 high in block 616.

Phase 4 begins in block 618 after the READ_DONE signal 422 is set to high. The READ_DONE signal 422 is input to the MUX 424 and switches the MUX output from PLL lock status and clock output over to the BIST controller memory read status output. The MUX 424 outputs the memory read status to the TDO 2 SoC TAP 420. This concludes the interleaved testing.

Figure 7:
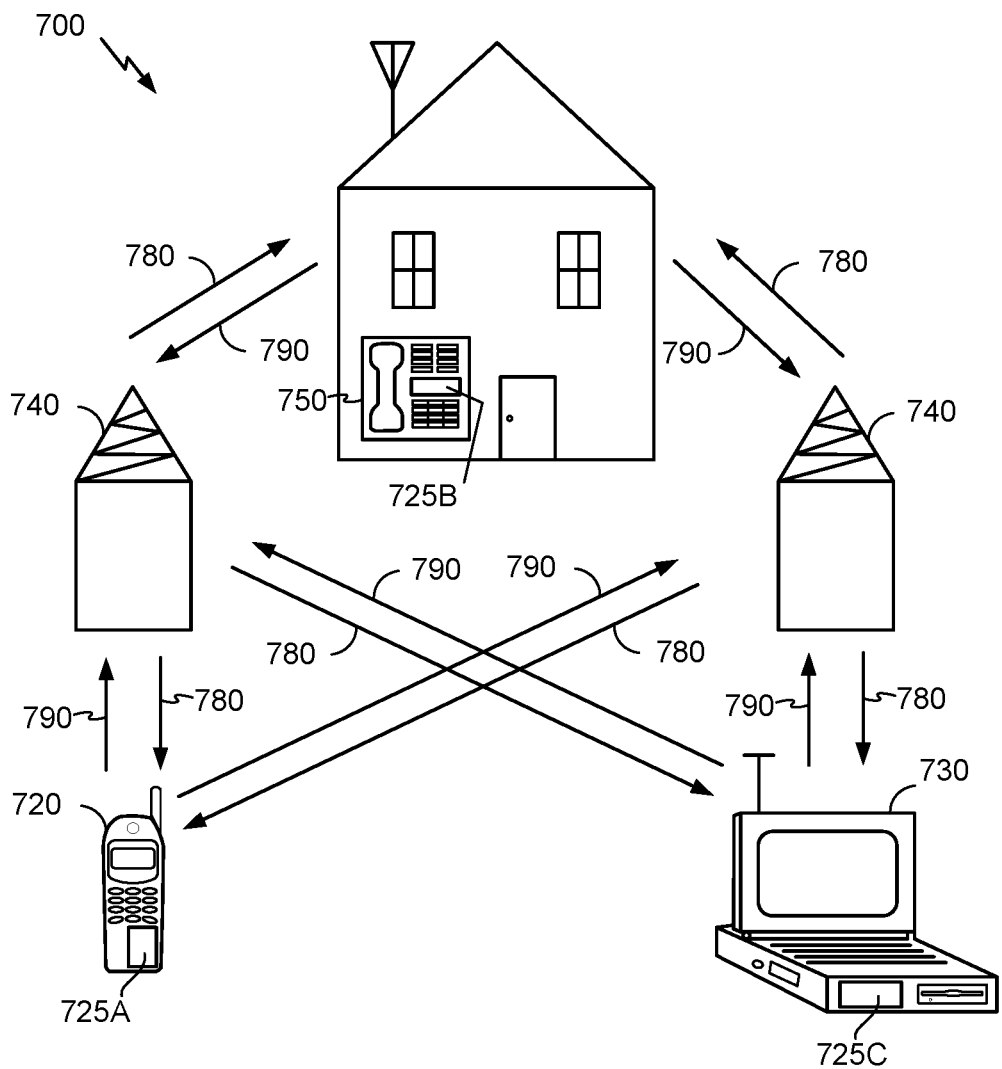
FIG. 7 is a block diagram showing an exemplary wireless communications system in which a configuration of the disclosure may be advantageously employed.

FIG. 7 is a block diagram showing an exemplary wireless communications system in which a configuration of the disclosure may be advantageously employed. For purposes of illustration, FIG. 7 shows three remote units 720, 730, and 750, and two base stations 740. It will be recognized that wireless communications systems may have many more remote units and base stations. Remote units 720, 730, and 750 include IC devices 725A, 725B, and 725C that include the disclosed wireless device incorporating the interleaved test execution architecture 400, shown in FIG. 4. It will be recognized that other devices may also be subject to the disclosed interleaved testing, such as the base stations, switching devices, and network equipment. FIG. 7 shows forward link signals 780 from the base stations 740 to the remote units 720, 730, and 750, and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 7 illustrates remote units according to the aspects of the present disclosure, the disclosure is not limited to these exemplary illustrated units. Aspects of the disclosure may be suitably employed in many devices, which are capable of the interleaved testing described above.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a standard cell circuit having signals indicative of instructions and data. The instructions and data are configured to cause one or more processors to implement the functions outlined in the claims.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

What is claimed is:

1. An apparatus for interleaved on-chip testing, comprising:
   a system-on-chip test access port (SoC TAP) in communication with a memory test access port (MTAP);
   a built-in self-test (BIST) controller in communication with the MTAP, a phase locked loop, and a memory; and
   a multiplexer in communication with the memory and in communication with the phase locked loop through an AND gate.

2. The apparatus of claim 1, in which the multiplexer is configured to toggle between testing the memory and testing the phase locked loop based on an output of the AND gate.

3. The apparatus of claim 1, in which the SoC TAP is configured to set up interleaved testing of the phase locked loop, the memory, and the physical layer.

4. The apparatus of claim 3, in which the SoC TAP is configured to test the transmit and receive subsystems of the physical layer.

5. The apparatus of claim 1, in which the MTAP is enabled by a MTAP enable command.

6. An apparatus for interleaved on-chip testing, comprising:
   means for merging a test setup involving a system-on-chip test access port (SoC TAP) communicating with a memory test access port (MTAP);
   means for communicating with the MTAP and a memory;
   means for communicating with the memory and a phase locked loop; and
   a multiplexer in communication with the memory and in communication with the phase locked loop through an AND gate.

7. The apparatus of claim 6, in which the multiplexer is configured to toggle between allowing testing the memory and allowing testing of the phase locked loop, based on an output of the AND gate.

8. The apparatus of claim 6, in which the the SoC TAP is configured to set up interleaved testing of the phase locked loop, the memory, and a physical layer.

9. The apparatus of claim 6 further comprising means for enabling the MTAP.

10. The apparatus of claim 6, in which a memory write operation is interleaved with waiting for the phase locked loop to lock.

11. The apparatus of claim 6, further comprising means for interleaving a lock detection and clock check operation with a wait period and data initiation from a transmitter.

12. The apparatus of claim 6, further comprising means for interleaving a memory read and a status check with a check for data at a receiver.

13. The apparatus of claim 6, in which the SoC TAP is configured to test transmit and receive subsystems of a physical layer.

\* \* \* \* \*